United States Patent [19]

Suzuki et al.

[11] 4,269,931

[45] May 26, 1981

[54] SUPPORTS FOR PRINTING PLATES

[75] Inventors: Kazuyoshi Suzuki; Teruo Takahashi; Tadashi Shingu, all of Hino; Kiyomi Naka, Kokubunji; Akihiro Horike, Hino, all of Japan

[73] Assignee: Teijin Limited, Osaka, Japan

[21] Appl. No.: 104,279

[22] Filed: Dec. 17, 1979

Related U.S. Application Data

[63] Continuation of Ser. No. 882,099, Mar. 1, 1978, abandoned.

[30] Foreign Application Priority Data

Mar. 8, 1977 [JP] Japan ............................ 52-24354

[51] Int. Cl.³ ............................................ G03C 1/68
[52] U.S. Cl. .................................. 430/271; 430/275; 430/278; 430/281; 430/510; 430/531; 430/284; 430/285
[58] Field of Search ............... 96/86 P, 87 R, 115 P, 96/115 R; 430/271, 275, 278, 281, 510, 531, 284, 285

[56] References Cited

U.S. PATENT DOCUMENTS

| | | |
|---|---|---|
| 3,715,293 | 2/1973 | Sandner et al. . |
| 3,801,329 | 4/1974 | Sandner et al. . |
| 3,861,921 | 1/1975 | Hoffmann et al. ............ 156/330 |
| 3,998,712 | 12/1976 | Hickman et al. ............ 204/159.15 |

FOREIGN PATENT DOCUMENTS

| | | |
|---|---|---|
| 46-1790 | 10/1971 | Japan . |
| 46-1791 | 10/1971 | Japan . |
| 48-6563 | 2/1973 | Japan . |
| 50-109003 | 8/1975 | Japan . |

*Primary Examiner*—Jack P. Brammer
*Attorney, Agent, or Firm*—Sherman & Shalloway

[57] ABSTRACT

An improved support comprising (A) a base plate and (B) an adhesive layer formed on the surface of the base plate is provided for making a printing plate from a liquid photosensitive resin. The improvement resides in the inclusion of a tertiary phosphite or tertiary phosphine in the adhesive layer. The improved adhesive layer acts to give reliefs of a good shoulder shape, and this action can be retained over long periods of time.

In an alternative embodiment, an activating layer (C) containing a tertiary phosphite or tertiary phosphine is formed on the adhesive layer.

25 Claims, No Drawings

SUPPORTS FOR PRINTING PLATES

This is a continuation of application Ser. No. 882,099, filed Mar. 1, 1978, now abandoned.

This invention relates to a support of a printing plate prepared from a liquid photosensitive resin. More specifically, the invention relates to a support of a printing plate prepared from a liquid photosensitive resin which can give relief images with a good shape.

Photopolymerizable resin compositions useful for producing relief printing plates have been known, and it has also been known that such a photopolymerizable composition is laminated on a support in the form of sheet or plate, and exposed to actinic light to cause crosslinkage and form relief images.

Generally, such a support includes an anti-halation layer and an adhesive layer. When a photosensitive resin composition is laminated on the support, and exposed to actinic light through a negative film bearing a transparent image, the photosensitive resin composition is difficult to crosslink at a part near the support because the amount of the actinic light which reaches that part is small. It is difficult therefore to obtain relief images having a good shape (with a cross section which is of a frustoconical shape with a broadened bottom), and defects are liable to be caused to the relief images during printing.

In an attempt to overcome such a disadvantage, a method was suggested in which exposure for relief formation is performed mainly through a negative film and simultaneously through a transparent support thereby to cure the photosensitive resin near the support at its entire surface corresponding to the support. This method is uneconomical because it requires a large amount of the photosensitive resin. It also has the defect that the resin layer cured on its entire surface is tacky after plate making, and its tackiness is retained even after carrying out after-exposure for long periods of time.

A method which involves forming a layer of an adhesive composition containing a photopolymerization initiator on a transparent support (Japanese Patent Publication No. 6563/75) was also suggested. According to this method, the migration of the initiator to the resin layer is not sufficient, and no sufficient effect can be produced.

A method was also suggested which involves forming on a substrate a layer composed of a mercapto-containing compound and a polymer binder (Japanese Laid-Open Patent Publication No. 109003/75). Although this method can give relief images having a good shoulder shape, the activating effect is sometimes reduced with time, or problems in working environment, such as the issuance of offensive odors by the use of the SH-containing compound, arise.

Accordingly, it is an object of this invention to provide a support for use in making a printing plate using a photosensitive resin, by the use of which a printing plate having reliefs made by the photopolymerization and curing of the liquid photosensitive resin can be made in situ, and the reliefs have a good frustoconical cross section with a broadened bottom.

Another object of this invention is to provide a support of a printing plate using a photosensitive resin, by the use of which reliefs having superior resistance to scratch and printing can be formed in situ from a liquid photosensitive resin.

The present inventors extensively worked on the aforesaid subject to achieve the objects of the invention, and found that by forming an activating layer containing a trivalent phosphorus compound selected from phosphite compounds and phosphine compounds, or both the phosphorus compound and a benzoin alkyl ether or a certain specified ketal compound as activating agents, reliefs having a good shoulder shape can be obtained without a variation in activating effect with time and the issuance of offensive odors.

According to this invention, there is provided a support comprising (A) a base plate, (B) an adhesive layer formed on the surface of the base plate and (C) an activating layer formed on the surface of the adhesive layer, wherein the activating layer contains (a) a trivalent phosphorus compound selected from (a-i) phosphite compounds and (a-ii) tertiary phosphine compounds, or both the phosphorus compound (a) and (b) a compound selected from (b-i) benzoin alkyl ethers and (b-ii) ketal compounds of the general formula

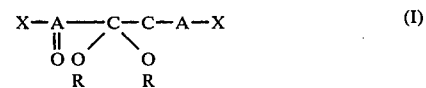

wherein X represents H, Cl, an alkyl group with 1 to 5 carbon atoms or an alkoxy group with 1 to 5 carbon atoms; A represents an aromatic residue having a six-membered ring and B represents an alkyl group with 1 to 10 carbon atoms, an aralkyl group with 7 to 9 carbon atoms, or the group $+C_nH_{2n}O_m^+R^1$ in which n represents an integer of 2 to 5, m represents an integer of 1 to 5, and $R^1$ represents an alkyl group with 1 to 5 carbon atoms, as activating agents.

The present inventors have also found that the activating agent (a) or activating agents (a) and (b) may be incorporated in the adhesive layer (B). In this case, it is of course not necessary to form the activating layer (C).

Accordingly, a novel aspect of the support of this invention is that an activating layer containing the activating agent (a) or the activating agents (a) and (b) is formed on the adhesive layer, or the activating agent (a) or the activating agents (a) and (b) are incorporated in the adhesive layer. When a photosensitive resin layer is formed on the support of this invention and photopolymerized and cured, the polymerization and crosslinking reactions of the resin at a part near the support are promoted and good relief images can be formed.

Examples of the trivalent phosphorus compound (a) used in the activating layer or adhesive layer of the support in accordance with this invention are triphenyl phosphite, tri-p-tolyl phosphite, tri-p-nonylphenyl phosphite, diphenyldecyl phosphite, diphenyltridecyl phosphite, tridecyl phosphite, tristearyl phosphite, triphenyl phosphine, tri-p-tolyl phosphine, diphenylmethyl phosphine, diphenylpropyl phosphine, dimethylphenyl phosphine, dipropylphenyl phosphine, and trioctyl phosphine. Of these compounds (a), phosphites or phosphines having at least one aromatic substituent are preferred. Triphenyl phosphite, tri-p-tolyl phosphite, tri-p-nonylphenyl phosphite, diphenyldecyl phosphite, diphenyltridecyl phosphite, triphenyl phosphine, tri-p-tolylphosphine, diphenylmethyl phosphine, diphenylpropyl phosphine, and dimethylphenyl phosphine are especially preferred.

Examples of the benzoin alkyl ether (b-i) and the ketal compound (b-ii) used in the activating layer or adhesive layer of the support in accordance with this invention include benzoin methyl ether, benzoin ethyl ether, benzoin isopropyl ether, benzoin n-butyl ether, benzoin isobutyl ether, benzil dimethyl ketal, benzil diethyl ketal, benzil dipropyl ketal, benzil-di($\beta$-phenylethyl) ketal, benzil-di(2-methoxyethyl) ketal, benzil-di(2-ethoxyethyl) ketal, benzil-di(2-methoxyethoxyethyl) ketal, benzil-di(2-ethoxyethoxyethyl) ketal, 4,4'-dimethylbenzil-dimethyl ketal, 2,2'-dimethoxybenzil-diethyl ketal, and 4,4'-dichlorobenzil dipropyl ketal. Of these, ketal compounds of the general formula (I) are preferred. Especially preferred species are benzil dimethyl ketal, benzil diethyl ketal, benzil-di(2-methoxyethyl) ketal, and 4,4'-dimethylbenzil-dimethyl ketal.

Compound (a) alone may be incorporated as an activating agent in the activating layer or adhesive layer, but the use of compounds (a) and (b) together is preferred. The amount of the compound (a) in the entire activating agent is preferably 20 to 100% by weight, more preferably 20 to 80% by weight. A combination of the compound (a) and the ketal compound (b-ii) produces the greatest activating effect. A combination of the compound (a) and the benzoin alkyl ether (b-i), and a combination of the compound (a) and the compounds (b-i) and (b-ii) can also be used with good results.

To prevent blocking, etc., a binder may be added to the activating layer [the compound (a) or both the compound (a) and the compound (b)]. Examples of the binder are inorganic binders, organic binders, and polymer binders. The organic binders and polymer binders are preferred, and the polymer binders are especially preferred.

Specific examples of the organic binders are malonic acid, adipic acid, succinic acid, suberic acid, sebacic acid, phthalic acid, trimellitic acid, succinic anhydride, phthalic anhydride, trimellitic anhydride, endomethylene tetrahydrophthalic anhydride, fumaric acid, dimethyl terephthalate, urea, $\epsilon$-caprolactam, naphthalene, and bisphenol A.

The polymer binder is a linear polymer which is soluble in solvent, such as polystyrene, an ethylene/vinyl acetate copolymer, polycarbonate, polyvinyl acetate, polyamides, polyesters, polyurethane, polyacrylates, polymethacrylates, acetates, ethyl cellulose, methyl cellulose, hydroxypropyl cellulose, and epoxy resins.

To ensure better adhesiveness of the photosensitive resin, it is preferred to use a binder having an acid anhydride group or carboxyl group and being soluble in an alkali aqueous solution in the activating layer. Examples of such a binder are succinic acid, succinic anhydride, phthalic anhydride, trimellitic anhydride, fumaric acid; and polymer binders, for example a copolymer of acrylic or methacrylic acid with an acrylate or methacrylate ester or another vinyl monomer, a copolymer of maleic anhydride with an olefin (e.g., methyl vinyl ether, styrene) and its alcohol-modified product, cellulose acetate terephthalate, cellulose acetate succinate, hydroxypropyl methyl cellulose phthalate, and a succinic acid-modified or phthalic acid-modified product of polyvinyl alcohol. These binders may be used singly or as a mixture of two or more.

The amount of the activating agent consisting of the trivalent phosphorus compound (a) or a mixture of it with the benzoin alkyl ether or ketal compound (b) in the activating layer is preferably 10 to 100% by weight, especially 20 to 90% by weight. The activating layer has a thickness of preferably 0.1 to 50 microns, especially preferably 1 to 20 microns.

The activating layer is formed on the surface of the adhesive layer which is formed on the support. This is accomplished by a method which comprises dissolving the activating agent [compound (a) or a mixture of it with compound (b)] and a binder in a solvent, and coating the resulting solution on the surface of the adhesive layer by a customary coating means such as a gravure coater, roll coater, kiss coater, reverse coater, bar coater or sprayer. If desired, the activating layer may contain small amounts of additives such as actinic light absorbers (e.g., inorganic pigments typified by red lead or red iron oxide, and organic pigments typified by Hansa Yellow 3G), or plasticizers.

The base plate of the support is made of a metal plate such as iron, stainless steel, zinc, or aluminum, a rubber sheet of a natural or synthetic rubber, or a plastic film or sheet such as polyethylene, polypropylene, polyethylene terephthalate or polyethylene naphthalene.

First, an adhesive layer (an anti-halation layer may also be formed) is formed on the surface of the base plate as described hereinabove. Instead of forming the activating layer on the surface of the adhesive layer, the compound (a) or a mixture of it with the compound (b) may be incorporated into the adhesive layer.

The suitable amount of the activating agent to be included in the adhesive layer is 10 to 70% by weight, preferably 15 to 50% by weight, based on the total amount of the adhesive layer.

If desired, an anti-halation agent may be incorporated in the adhesive layer to make it serve also as an anti-halation layer. However, an anti-halation layer may be separately provided between the adhesive layer and the support.

When the base plate is a plate which reflects the light well (e.g., an aluminum plate), the anti-halation layer preferably absorbs at least 70% of the actinic light which arrives at the support. Examples of such a light absorber include inorganic pigments typified by red lead and red iron oxide, organic pigments and dyes typified by Hansa Yellow 3G, and ultraviolet absorbers typified by Tinuvin 327.

The adhesive layer serves to bond the relief layer to the base plate or anti-halation layer firmly. It is made of, for example, a polyurethane resin, an epoxy resin, a polyester resin, a polyamide resin, a polyvinyl alcohol resin, a vinyl chloride vinyl acetate copolymer, a resorcinol/formaldehyde resin, and modified products of these polymers. Preferably, the adhesive layer consists of a polyurethane resin or epoxy resin cross-linked on the base plate.

Preferred polyurethane resins are cross-linked polyester-polyurethane resins obtained by reacting (A) a linear polyester-polyurethane derived from a linear polyester and a diisocyanate with (B) polyfunctional isocyanates on the base plate as described, for example, in U.S. Pat. No. 3,948,666 and Japanese Laid-Open Patent Publications Nos. 133102/74 and 135702/74. The linear polyester-polyurethane (A) is a polyadduct formed between an aliphatic polyester with a molecular weight of 500 to 6,000 and a diisocyanate such as 2,4-tolylene diisocyanate (TDI for short) or diphenylmethane diisocyanate (MBI for short), and preferably has a molecular weight of 10,000 to 100,000.

Examples of the polyfunctional isocyanate (B) are an adduct formed between trimethylolpropane and TDI (e.g., Desmodur L, a trademark for a product of Bayer AG), an adduct formed between trimethylolpropane and xylylene diisocyanate, triphenylmethane-4,4',4"-triisocyanate (Desmodur R) and a condensate of a diisocyanate such as Desmodur IL, Desmodur CT, a trimer of TDI, or Desmodur N.

Bifunctional isocyanates useful for chain-extending linear polyesters to form the polyester-polyurethane resins can also be used as the polyfunctional isocyanates.

As described in the above patent and patent publications, the presence of a non-gaseous compound having a photopolymerizable ethylenic double bond as a component (C) during the reaction of compounds (A) and (B) is very effective. Examples of the compound (C) are acrylic or methacrylic acid esters such as 2-hydroxyethyl (meth)acrylate, diethylene glycol di(meth)acrylate or trimethylolpropane di(meth)acrylate, vinyl esters such as vinyl acetate, styrene compounds, amide compounds such as (meth)acrylamine or diacetone (meth)acrylamide, and allyl monomers such as diallyl phthalate. Of these compounds, those having a boiling point of at least 100° C., at atmospheric pressure are preferred, and those having at least two ethylenic carbon-to-carbon double bonds in the molecule are most preferred. Furthermore, the compounds having a photopolymerizable ethylenic double bond can more suitably be used when they contain active hydrogen capable of reacting with isocyanate groups.

Preferably, the epoxy resin is a cured epoxy resin obtained by reacting (A) a compound containing at least two 1,2-epoxy groups in the molecule, (B-i) a compound containing an effectively photopolymerizable unsaturated carbon-to-carbon double bond and a 1,2-epoxy group in the molecule and having a boiling point of at least 120° C., or (B-ii) a compound containing an effectively photopolymerizable unsaturated carbon-to-carbon double bond and an amino group in the molecule and having a boiling point of at least 120° C., and (C) a curing agent.

Examples of preferred compounds having at least two 1,2-epoxy groups in the molecule [component (A)] are linear polycondensation products formed between epichlorohydrin and polyhydric phenolic compounds, for example, epoxy resins, having a molecular weight of 400 to 4,000 obtained by condensing 2,2-bis(4'-hydroxyphenyl)propane (i.e., bisphenol A) with epichlorohydrin in an alkaline solution, epoxy resins obtained from novolac resins synthesized from phenol and formaldehyde, and epichlorohydrin, or epoxy resins obtained by condensing a condensate of resorcinol and acetone with epichlorohydrin in an alkaline solution.

Examples of the compound having an effectively photopolymerizable carbon-to-carbon double bond and a 1,2-epoxy group in the molecule and having a boiling point of at least 120° C. [component (B-i)] are glycidyl acrylate, glycidyl methacrylate, glycidyl allyl ether, epoxy acrylate type resins obtained by condensing some of the epoxy groups of the polyepoxy compound exemplified above as component (A) with acrylic or methacrylic acid.

Of these, glycidyl acrylate, glycidyl methacrylate and epoxy acrylate type resins are preferred.

Examples of the compound having an effectively photopolymerizable carbon-to-carbon double bond and an amino group and having a boiling point of at least 120° C. [component (B-ii)] are reaction products of the component (B-i) with amine curing agents [component (C)] to be described, preferably reaction products obtained by reacting glycidyl acrylate, glycidyl methacrylate or glycidyl allyl ether with some of the active hydrogens of polyamines such as hexamethylene diamine, more preferably reaction products formed between glycidyl methacrylate and polyamide resins.

Any known curing agents for epoxy resins, for example, compounds having at least two active hydrogen atoms in the molecule, such as amines acid anhydrides, polycarboxylic acids, or tertiary amines, can be used as the curing agent [component (C)].

Of these curing agents, an amino-terminated polyamide resin obtained by the condensation of an aliphatic dicarboxylic acid with ethylenediamine and having a degree of polymerization of 5 to 20 is especially useful because of its ability to provide moderate affinity between the cured film on the support and the liquid photosensitive resin.

These compounds (A), (B-i), (B-ii), and (C) are preferably used in a combination of (A), (B-i) and (C), or (A), (B-ii) and (C), or (B-i) and (C), or (A) and (B-ii), or (B-i) and (B-ii).

The adhesive layer is formed on the base plate by a method which comprises dissolving an adhesive or both the adhesive and the activating agent in a solvent, and coating the resulting solution to a suitable thickness on the base plate by a customary coating means such as a gravure coater, roll coater, kiss coater, reverse coater, bar coater or sprayer. If desired, the adhesive layer may contain small amounts of additives such as actinic light absorbers (e.g., inorganic pigments typified by red lead or red iron oxide, and organic pigments typified by Hansa Yellow 3G), and plasticizers.

The thickness of the adhesive layer is 1 to 300 microns, preferably 5 to 50 microns.

In an especially preferred embodiment of the present invention, an activating layer soluble in a liquid photosensitive resin is formed on the cross-linked adhesive layer (containing an anti-halation layer, or the anti-halation layer exists separately) which is on the base plate.

Liquid photosensitive resins which can be suitably used for the support of this invention is, for example, a mixture having flowability at room temperature and being composed of a photopolymerization initiator capable of being easily activated by actinic light and a composition composed mainly of a compound having an ethylenic carbon-carbon double bond which can be polymerized or cross-linked.

For example, it may consist of a polymer such as a vinyl chloride copolymer, an acrylate copolymer, a polyvinyl alcohol derivative, a cellulose derivative, a polyurethane, or a polyester (particularly, unsaturated polyesters) and a photopolymerizable monomer such as acrylic or methacrylic acid, a derivative thereof such as its ester or amide, or one or more vinyl esters. To exhibit the superior effect of the support of this invention, the liquid photosensitive resin preferably contains 10% by weight, preferably at least 15% by weight, of a compound having a (meth)acrylate group. Especially preferred photosensitive liquid resins consist of (1) an unsaturated polyester resin composition and an unsaturated polyurethane resin composition which have in the molecular chain a carbon-carbon double bond active to actinic light, either alone or as a mixture, (2) a photopolymerizable monomer and (3) a photopolymerization initiator.

There is no special restriction on these resin compositions, and they may be any known compositions or compositions having properties similar to those of the known compositions.

The liquid photosensitive resins usually contain a photopolymerization initiator such as diacetyl, benzil, benzoin, benzoin alkyl ethers, anthraquinones, eosin, thionine, and thiol, and a small amount of a heat polymerization inhibitor such as p-benzoquinone, naphthoquinone, hydroquinone, p-methoxyphenol, N,N'-diphenyl-p-phenylenediamine or N-methyl-N-isopropyl nitroamine.

The liquid photosensitive resin is applied uniformly in a thickness of 0.2 to 3.0 mm to the support of this invention, and exposed to actinic light through a negative film bearing a line drawing by using a light source such as a tungsten-filament lamp, an ultraviolet fluorescent lamp, a carbon arc lamp, a mercury lamp or a xenon lamp to cure the resin selectively. The unexposed portion is removed physically or by washing it with a wash-out solution to form a relief image. By the application of actinic light, the activating agent in the activating layer or the adhesive layer works and activates the photosensitive resin at that part which is near the support, and consequently, the relief image has a good frustoconical shape with a broadened bottom. Such a good shape increases the adhesion strength of the relief in lines and dots, and no detachment of the image occurs.

Printing plates made by using the support of this invention have excellent resistance to printing and permit a very firm adhesion between the relief image and the support. These printing plates can be directly used on a printing press, or can be utilized as a matrix for a molding plate.

The following Examples and Comparative Examples illustrate the present invention. In these examples, all percentages and parts are by weight.

EXAMPLES 1 TO 4 AND COMPARATIVE EXAMPLES 1 TO 3

(A) Production of a support

A polyester-polyurethane resin having a molecular weight of about 40,000 obtained by chain-extending hydroxy-terminated polyethylene adipate having an average molecular weight of 1,300 with 2,4-tolylene diisocyanate was dissolved in ethyl acetate to form a 35% solution.

To 100 parts of the resulting 35% solution were added 19 parts of a 75% ethyl acetate solution of an adduct of trimethylolpropane with 2,4-tolylene diisocyanate (Coronate L, a trademark for a product of Nippon Polyurethane K.K.), 5 parts of 2-hydroxyethyl methacrylate, and then 3 parts of Cromophthal Yellow A2R (a trademark for a product of Ciba-Geigy), and they were well milled. The resulting composition was coated uniformly on a polyethylene terephthalate film having a thickness of 250 microns by using a bar coater. The coating was pre-dried at 80° C. for 10 minutes, and then heat-treated at 120° C. for 2 hours to form an adhesive layer having a coating thickness of about 15 microns.

Eight parts of each of the activating agents shown in Table 1, and 2 parts of cellulose acetate phthalate as a binder were dissolved in acetone to form a solution having a solids content of 15%. The resulting solution was uniformly coated on the adhesive layer by a No. 10 bar coater to form an activating layer. After drying, the activating layer had a thickness of about 2 microns.

(B) Production of a liquid photosensitive resin

Diethylene glycol (960 parts), 150 parts of phthalic anhydride, 500 parts of maleic anhydride and 580 parts of adipic acid were reacted in a nitrogen atmosphere at 100° to 120° C. for 30 minutes, and then at 200° C. for 5 hours to afford an unsaturated polyester having an acid value of 100. To 62 parts of the unsaturated polyester were added 7 parts of acrylamide, 0 parts of tetraethylene glycol diacrylate, 5 parts of diallyl phthalate, 16 parts of 2-hydroxyethyl methacrylate, 1.2 parts of benzoin isopropyl ether and 0.02 part of p-methoxyphenol to afford a liquid photosensitive resin.

(C) Production of a photosensitive resin plate

The liquid photosensitive resin obtained in (B) was coated uniformly to a thickness of 0.7 mm on the support obtained in (A). The photosensitive resin layer was then covered with a polyethylene terephthalate film having a thickness of 6 microns, and exposed for 8 minutes to actinic light from a 60 W ultraviolet fluorescent lamp through a negative film which had dots with a diameter of 170 microns and 200 microns, halftone dots with 2% and 3% dot areas and 65 lines per inch and relief line images with a width of 40 microns in its line drawing portion. The resin at the unexposed portion was washed away with a 2% sodium carbonate solution, and after-exposure was performed for 30 minutes by using a 20W ultraviolet fluorescent lamp to form a plate with a relief image. The characteristics of the resulting plate are shown in Table 2.

TABLE 1

| Example (Ex.) or Comparative Example (CEx.) | Activating agent combinations | |
|---|---|---|
| | Compound (a) | Compound (b) |
| Ex. 1 | Benzil dimethyl ketal (50) | Triphenyl phosphite (50) |
| Ex. 2 | Benzil-di(2-methoxyethyl) ketal (50) | Diphenyldecyl phosphite (50) |
| Ex. 3 | 4,4'-Dimethylbenzil dimethyl ketal (50) | Triphenyl phosphine (50) |
| Ex. 4 | Benzoin ethyl ether (50) | Triphenyl phosphite (50) |
| CEx. 1 | Benzile dimethyl ketal (100) | — |
| CEx. 2 | — | Triphenyl phosphate (100) |
| CEx. 3 | Benzoin ethyl ether (100) | |

The parenthesized figures in Table 1 indicate the amount in weight percent of the compound (a) or (b) based on the total amount of the activating agent.

TABLE 2

| Example (Ex.) or Comparative Example (CEx. | Characteristics of the plate | | | | | |
|---|---|---|---|---|---|---|
| | Shoulder shape | Dots | | Relief line image | Halftone dots | |
| | | 170 μ | 200 μ | (40 μ) | 2% | 3% |
| Ex. 1 | A | O | O | O | O | O |
| Ex. 2 | A | O | O | O | O | O |
| Ex. 3 | A | O | O | O | O | O |

TABLE 2-continued

| Example (Ex.) or Comparative Example (CEx. | Characteristics of the plate | | | | | |
|---|---|---|---|---|---|---|
| | Shoulder shape | Dots 170 μ | Dots 200 μ | Relief line image (40 μ) | Halftone dots 2% | Halftone dots 3% |
| Ex. 4 | B | O | O | O | X | O |
| CEx. 1 | C | X | O | O | X | O |
| CEx. 2 | C | X | O | O | X | O |
| CEx. 3 | D | X | X | X | X | X |

The dots, relief line images and halftone dots were evaluated for degree of adhesion: O shows complete adhesion, and X shows dropping or incomplete adhesion. The shoulder shape was evaluated on the scale of A which shows a coefficient of activating effect (as described hereinbelow) of at least 5.0; B which shows an activating effect coefficient of 4.5 to less than 5.0; C which shows an activating effect coefficient of 3.0 to less than 4.5; and D which shows an activating effect coefficient of less than 3.0.

The results given in Table 2 show that the conjoint use of the compounds (a) and (b) as an activating agent in the activating layer of the support of this invention produces a synergistic effect, and the characteristics of the resulting plate are improved.

EXAMPLE 5 AND COMPARATIVE EXAMPLE 4

A 0.3 mm thick aluminum plate was coated with an adhesive layer composition consisting of 40 parts of Epikote 1004 (a trademark for a product of Shell Chemical Co.), 30 parts of Versamide 125 (a product of Daiichi General K.K.), 30 parts of glycidyl allyl ether, 35 parts of red lead, 50 parts of toluene and 50 parts of diacetone alcohol. The coating was dried at 60° C. for 30 minutes, and then baked at 100° C. for 30 minutes.

A solution (solids content 13%) in acetone of 5 parts of cellulose acetate phthalate as a binder and 4 parts of benzil dimethyl ketal and 3 parts of triphenyl phosphite as an activating agent was coated on the surface of the adhesive layer by a No. 26 bar coater. After drying, the thickness of the activating layer was about 5 microns.

For comparison, a support having an activating layer was produced in the same manner as described above except that 7 parts of thioglycolic acid was used instead of the activating agent.

The liquid photosensitive resin obtained in Example 1 was uniformly coated to a thickness of 0.7 mm on each of the two supports, and exposed for 8 minutes through the same negative film as used in Example 1 in the same way as in Example 1. The resin at the unexposed portion was washed with a 2% sodium carbonate solution, and after-exposure was performed for 30 minutes to obtain a plate with a relief image.

The relief images on these two printing plates had a good shoulder shape, and all the lines in the negative film were reproduced in these plates.

Separately, each of the two supports obtained was stored for 3 months at 30° C. and a humidity of 80%, and then plates with relief images were produced by using these supports in the same way as above. In the plate produced from the support containing thioglycolic acid as the activating agent (Comparative Example), drop-off was observed in dots with a diameter of 170 microns and 200 microns, halftone dots with 2% and 3% dot areas and 65 lines per inch, and relief image lines with a width of 40 microns, indicating a reduction in activating effect. But, in the plate produced from the support containing benzil dimethyl ketal and triphenyl phosphite as activating agents, these dots, halftone dots and relief line images were completely reproduced, and no reduction in activating effect was observed.

EXAMPLE 6 AND COMPARATIVE EXAMPLE 5

(A) Production of a support

A polyester-polyurethane resin having a molecular weight of about 40,000 and obtained by chain-extending hydroxy-terminated polyethylene adipate having an average molecular weight of 1,300 with 2,4-tolylene diisocyanate was dissolved in ethyl acetate to form a 35% solution.

To 100 parts of the resulting 35% solution were added 19 parts of a 75% ethyl acetate solution of an adduct of trimethylolpropane and 2,4-tolylene diisocyanate (Coronate L), 5 parts of 2-hydroxyethyl methacrylate, and 3 parts of Cromophthal Yellow A2R. To 100 parts of the resulting adhesive layer solution were added 4.5 parts of benzil dimethyl ketal and 13.5 parts of triphenyl phosphite as activating agents. The mixture was well milled, and coated uniformly on a polyethylene terephthalate film having a thickness of 250 microns by using a bar coater. The coating was pre-dried at 80° C. for 10 minutes, and then heat-treated at 120° C. for 2 hours to afford a support plate which had an adhesive layer containing the activating agents. The thickness of the adhesive layer was about 15 microns.

For comparison, a support was produced in the same way as above except that the activating agents were not used.

(B) Production of a photosensitive resin plate

The same liquid photosensitive resin as obtained in Example 1, (B) was coated uniformly to a thickness of 0.7 mm on each of the supports obtained in (A) above. The coating was covered with a polyethylene terephthalate film having a thickness of 6 microns, and exposed for 8 minutes through the same negative film as used in Example 1, (C) and post-treated in the same way as in Example 1, (C) to afford a plate with a relief image.

In the plate produced from the support containing the activating agents, all dots, halftone dots and relief line images in the negative film were completely reproduced. However, in the comparison run, the reliefs were not reproduced.

EXAMPLES 7 TO 10 AND COMPARATIVE EXAMPLES 6 AND 7

Supports were produced in the same way as in Example 6 except that the activating agents shown in Table 3 were used instead of the benzil dimethyl ketal and triphenyl phosphite used in Example 6.

TABLE 3

| Example (Ex.) or Comparative Example (CEx.) | Compound (a) | Compound (b-ii) | Compound (b-i) |
|---|---|---|---|
| Ex. 7 | Bipenyldecyl phosphite (9 parts) | Benzil di(2-methoxyethoxyethyl) ketal (9 parts) | — |
| Ex. 8 | Triphenyl phosphite (18 parts) | — | — |
| Ex. 9 | Triphenyl phosphite | — | Benzoin methyl ether |

TABLE 3-continued

| Example (Ex.) or Comparative Example (CEx.) | Compound (a) | Compound (b-ii) | Compound (b-i) |
|---|---|---|---|
| Ex. 10 | (9 parts) Triphenyl phosphite (7.2 parts) | Benzil di(2-methoxyethyl) ketal (7.2 parts) | (9 parts) Benzoin ethyl ether (3.6 parts) |
| CEx. 6 | — | Benzil dimethyl ketal (18 parts) | — |
| CEx. 7 | — | — | Benzoin ethyl ether (18 parts) |

The same liquid photosensitive resin as produced in Example 1, (B) was coated on each of the supports and exposed and treated in the same way as in Example 1 to form plates with relief images. In Comparative Example 7, dots with a diameter of 170 microns did not adhere to the support, but in all other runs, the lines were reproduced.

To evaluate the effect of the activating agents used in Examples 7 to 10 and Comparative Examples 6 and 7, the radius of that surface of a dot with a diameter of 170$\mu$ which adhered to the support was measured by a universal projector (a product of Nippon Kogaku K.K.) and the measured value was divided by the radius of the dot in the negative film (170 microns). The resulting value was made a coefficient of activating effect. The results are shown in Table 4.

TABLE 4

| Example | Coefficient of activating effect |
|---|---|
| Example 7 | 5.3 |
| Example 8 | 4.7 |
| Example 9 | 4.7 |
| Example 10 | 5.0 |
| Comparative Example 6 | 2.5 |
| Comparative Example 7 | 0 |

As shown in Table 4, the coefficients of activating effect were large, and represented a good relief shoulder. In the Comparative Examples, the dots did not adhere to the support, or the coefficients of activating effect were small and represented an unstable relief shoulder. For this reason, the printing plates obtained in the Comparative Examples could not endure printing.

EXAMPLE 11 AND COMPARATIVE EXAMPLES 8 AND 9

Supports were produced in the same way as in Example 6 except that a 1:1 (by weight) mixture of triphenyl phosphite and benzil dimethyl ketal was used in each of the amounts shown in Table 5 instead of the activating agent used in Example 6.

TABLE 5

| Example | Amount of the activating agent (parts) | Content of the activating agent in the adhesive layer (%) |
|---|---|---|
| Example 11 | 18 | 29 |
| Comparative Example 8 | 2.4 | 5 |
| Example 9 | 135 | 75 |

Using these supports, plates with relief images were produced in the same way as in Example 6. In Example 11, the coefficient of activating effect was as high as 5.2, and the relief image exhibited a good shoulder shape. In Comparative Example 8, the activating effect was small, and drop-off was seen in dots having a diameter of 170 microns, halftone dots with 2% dot area and 65 lines per inch and relief line images with a width of 40 microns, and the resulting plate was useless as a printing plate. In Comparative Example 9, the activating effect was sufficient, but the adhesive layer did not have solvent resistance. Thus, when the plate in Comparative Example 9 was washed with a washing oil for printing ink, dots and relief line images peeled off from the support, and the plate could not be used in printing.

When the plate obtained in Example 11 was repeatedly washed with the same washing oil, the relief images remained firmly adhered to the support, and the plate could endure repeated printing.

EXAMPLE 12

In adhesive composition consisting of 40 parts of Epikote 1004, 30 parts of Versamide and 30 parts of glycidyl allyl ether was admixed with 3 parts of 2-(2'-hydroxy-3',5'-ditert.butylphenyl)-5-chlorobenzotriazole as a light absorber, 20 parts of triphenyl phosphite and and 30 parts of benzil dimethyl ketal as activating agents, and 50 parts of toluene and 50 parts of diacetone alcohol as solvents. The resulting composition was coated on a 0.3 mm thick aluminum plate (treated with chromic acid), dried at 60° C. for 30 minutes, and baked at 100° C. for 30 minutes to obtain a support having a 25-micron thick adhesive layer containing activating agents.

The same liquid photosensitive resin as obtained in Example 1 was uniformly coated to a thickness of 0.7 mm on the resulting support, and exposed for 8 minutes through the same negative film as used in Example 1. The resin at the unexposed portion was washed with a 2% sodium carbonate solution, and after-exposure was performed for 30 minutes to afford a plate with a relief image. The plate had a coefficient of activating effect of 6.0 showing a good shoulder shape.

What we claim is:

1. In a support for use in making a printing plate using a liquid photosensitive resin selected from the group consisting of polyester resin, polyurethane resin and mixtures thereof, the support comprising (A) a base plate, (B) an adhesive layer formed on the surface of the base plate, and (C) an activating layer formed on the surface of the adhesive layer; the improvement wherein the activating layer (C) comprises as an activating agent a phosphorus compound (a) selected from the group consisting of tertiary phosphite compound (a-i) and tertiary phosphine compound (a-ii) in an amount of about 10–100 weight percent and having a thickness of 0.1–50 microns.

2. The support of claim 1 wherein the activating layer additionally contains as an activating agent a compound (b) selected from the group consisting of benzoin alkyl ethers (b-i) and ketal compounds (b-ii) of the formula

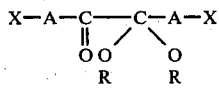

wherein X represents a hydrogen atom, a chlorine atom, an alkyl group with 1 to 5 carbon atoms or an alkoxy group with 1 to 5 carbon atoms; A represents an aromatic residue having a six-membered ring; and R represents an alkyl group with 1 to 10 carbon atoms, an aralkyl group with 7 to 9 carbon atoms or the group $\text{+}C_nH_{2n}O_m^+R^1$ in which n represents an integer of 2 to 5, m represents an integer of 1 to 5 and $R^1$ represents an allkyl group with 1 to 5 carbon atoms.

3. The support of claim 1 wherein the activating layer consists of the activating agent and an organic solvent-soluble linear polymer binder.

4. The support of claim 3 wherein the amount of the polymer binder in the activating layer is 20 to 90% by weight.

5. The support of claim 2 wherein the ratio of the activating agent (a) to the activating agent (b) is 2:8 to 8:2.

6. The support of claim 1 wherein the activating agent (a) contains at least one aromatic substituent in the molecule.

7. The support of claim 1 wherein the adhesive layer is a layer of an epoxy resin or polyurethane resin.

8. In a support for use in making a printing plate using a liquid photosensitive resin, the support comprising (A) a base plate and (B) an adhesive layer formed on the surface of the base plate; the improvement wherein the adhesive layer (B) comprises as an activating agent for liquid photosensitive resins a phosphorus compound (a) selected from the group consisting of tertiary phosphite compounds (a-i) and teritary phosphine compounds (a-ii) in an amount of about 10–100 weight percent and having a thickness of 0.1–50 microns.

9. The support of claim 8 wherein the adhesive layer (B) additionally contains as an activating agent a compound (b) selected from the group consisting of benzoin alkyl ethers (b-i) and ketal compounds (b-ii) of the formula

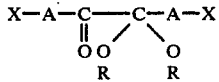

wherein X represents a hydrogen atom, a chlorine atom, an alkyl group with 1 to 5 carbon atoms or an alkoxy group with 1 to 5 carbon atoms; A represents an aromatic residue having a six-membered ring; and R represents an alkyl group with 1 to 10 carbon atoms, an aralkyl group with 7 to 9 carbon atoms or the group $\text{+}C_nH_{2n}O_m^+R^1$ in which n represents an integer of 2 to 5, m represents an integer of 1 to 5, and $R^1$ represents an alkyl group with 1 to 5 carbon atoms.

10. The support of claim 1 wherein the adhesive layer (B) is a layer of a cross-linked epoxy resin or polyurethane resin having an effectively photopolymerizable unsaturated carbon-to-carbon double bond.

11. The support of claim 1 wherein the liquid photosensitive resin consists of (1) an unsaturated polyester resin composition and an unsaturated polyurethane resin composition both having in the molecular chain a carbon-to-carbon double bond active to actinic light, either alone or as a mixture, (2) a photopolymerizable monomer, and (3) a photopolymerization initiator.

12. The combination of a light-sensitive element support and a liquid photosensitive resin for use in making a printing plate comprising as the support (A) a base plate, (B) an adhesive layer formed on the surface of the base plate, and (C) an activating layer formed on the surface of the adhesive layer and comprising a phosphorus compound (a) selected from the group consisting of tertiary phosphite compound (a-i) and tertiary phosphine compound (a-ii) in an amount of about 10–100 weight percent and having a thickness of 0.1–50 microns; said liquid photosensitive resin being in the form of a layer overlying said activating layer (C), said liquid photosensitive resin being selected from the group consisting of polyester resin, polyurethane resin and mixtures thereof.

13. The combination of the light-sensitive element support and liquid photosensitive resin according to claim 12 wherein the activating layer additionally contains as an activating agent a compound (b) selected from the group consisting of benzoin alkyl ethers (b-i) and ketal compounds (b-ii) of the formula

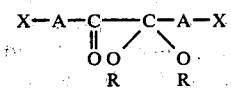

wherein X represents a hydrogen atom, a chlorine atom, an alkyl group with 1 to 5 carbon atoms or an alkoxy group with 1 to 5 carbon atoms; A represents an aromatic residue having a six-membered ring; and R represents an alkyl group with 1 to 10 carbon atoms, an aralkyl group with 7 to 9 carbon atoms or the group $\text{+}C_nH_{2n}O_m^+R^1$ in which n represents an integer of 2 to 5, m represents an integer of 1 to 5 and $R^1$ represents an alkyl group with 1 to 5 carbon atoms.

14. The combination of the light-sensitive element support and liquid photosensitive resin according to claim 12 wherein the activating layer consists of the activating agent and an organic solvent-soluble linear polymer binder.

15. The combination of the light-sensitive element support and liquid photosensitive resin according to claim 14 wherein the amount of the polymer binder in the activating layer is 20 to 90% by weight.

16. The combination of the light-sensitive element support and liquid photosensitive resin according to claim 13 wherein the ratio of the activating agent (a) to the activating agent (b) is 2:8 to 8:2.

17. The combination of the light-sensitive element support and liquid photosensitive resin according to claim 12 wherein the activating agent (a) contains at least one aromatic substituent in the molecule.

18. The combination of the light-sensitive element support and liquid photosensitive resin according to claim 12 wherein the adhesive layer is a layer of an epoxy resin or polyurethane resin.

19. The combination of a light-sensitive element support and a liquid photosensitive resin for use in making a printing plate comprising as the support (a) a base plate and (B) an adhesive layer formed on the surface of the base plate, said adhesive layer comprising an activating agent for said liquid photosensitive resin which is a phosphorus compound (a) selected from the group consisting of tertiary phosphite compound (a-i) and tertiary phosphine compound (a-ii) in an amount of about 10–100 weight percent and an adhesive, said layer having a thickness of about 0.1 to 50 microns; said liquid photosensitive resin being in the form of a layer overlying said adhesive layer (B), said liquid photosensitive resin being selected from the group consisting of polyester resin, polyurethane resin and mixtures thereof.

20. The combination of the light-sensitive element support and liquid photosensitive resin according to claim 19 wherein the adhesive layer (B) additionally contains as an activating agent a compound (b) selected from the group consisting of benzoin alkyl ethers (b-i) and ketal compounds (b-ii) of the formula

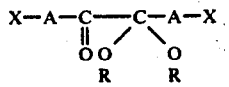

wherein X represents a hydrogen atom, a chlorine atom, an alkyl group with 1 to 5 carbon atoms or an alkoxy group with 1 to 5 carbon atoms; A represents an aromatic residue having a six-membered ring; and R represents an alkyl group with 1 to 10 carbon atoms, an aralkyl group with 7 to 9 carbon atoms or the group $+C_nH_{2n}O+_mR^1$ in which n represents an integer of 2 to 5, m represents an integer of 1 to 5, and $R^1$ represents an alkyl group with 1 to 5 carbon atoms.

21. The combination of the light-sensitive element support and liquid photosensitive resin according to claim 20 wherein the ratio of the activating agent (a) to the activating agent (b) is 2:8 to 8:2.

22. The combination of the light-sensitive element support and liquid photosensitive resin according to claim 19 wherein the activating agent (a) contains at least one aromatic substituent of the molecule.

23. The combination of the light-sensitive element support and liquid photosensitive resin according to claim 19 wherein the adhesive in the adhesive layer is an epoxy resin or polyurethane resin.

24. The combination of the light-sensitive element support and liquid photosensitive resin according to claims 12 or 19 wherein the adhesive layer (B) is a layer of a cross-linked epoxy resin or polyurethane resin having an effectively photopolymerizable unsaturated carbon-to-carbon double bond.

25. The combination of the light-sensitive element support and liquid photosensitive resin according to claims 12 or 19 wherein the liquid photosensitive resin consists of (1) an unsaturated polyester resin composition and an unsaturated polyurethane resin composition both having in the molecular chain a carbon-to-carbon double bond active to actinic light, either alone or as a mixture, (2) a photopolymerizable monomers, and (3) a photopolymerization initiator.

* * * * *